(12) United States Patent
Ufert

(10) Patent No.: US 7,983,068 B2
(45) Date of Patent: Jul. 19, 2011

(54) MEMORY ELEMENT WITH POSITIVE TEMPERATURE COEFFICIENT LAYER

(75) Inventor: Klaus-Dieter Ufert, Unterschleissheim (DE)

(73) Assignee: Qimonda AG, Munich (DE)

( * ) Notice: Subject to any disclaimer, the term of this patent is extended or adjusted under 35 U.S.C. 154(b) by 641 days.

(21) Appl. No.: 12/030,059

(22) Filed: Feb. 12, 2008

(65) Prior Publication Data
US 2009/0201716 A1   Aug. 13, 2009

(51) Int. Cl.
*G11C 11/00*   (2006.01)
(52) U.S. Cl. .................... 365/148; 257/4; 257/E45.003; 365/163; 438/382
(58) Field of Classification Search .................. 365/148, 365/163, 174; 257/4, E45.003; 438/382
See application file for complete search history.

(56) References Cited

U.S. PATENT DOCUMENTS

| | | | |
|---|---|---|---|
| 6,813,177 B2 * | 11/2004 | Lowrey et al. | 365/148 |
| 6,969,869 B2 * | 11/2005 | Hudgens et al. | 257/50 |
| 7,009,694 B2 * | 3/2006 | Hart et al. | 365/163 |
| 7,297,975 B2 * | 11/2007 | Ufert | 257/2 |
| 7,723,714 B2 * | 5/2010 | Karg et al. | 257/3 |
| 2005/0088872 A1 * | 4/2005 | Ma | 365/148 |
| 2006/0203541 A1 * | 9/2006 | Toda | 365/163 |
| 2007/0076486 A1 * | 4/2007 | Jeong et al. | 365/185.22 |
| 2009/0272958 A1 * | 11/2009 | Ufert et al. | 257/2 |

OTHER PUBLICATIONS

Kim et al., "Study of Transport and Dielectric of Resistive Memory States in NiO Thin Film," Japanese Journal of Applied Physics, vol. 44, No. 42, published 2005. pp. L1301-L1303.*

Kim et al., "Improvement of Resistive Memory Switching in NiO using IrO2," Applied Physics Letters 88, 232106, published 2006. pp. 1-3.*

Gibbons, J.F., et al., "Switching Properties of Thin NiO Films," Solid-State Electronics, 1964, pp. 785-797, vol. 7, Pergamon Press, Great Britain.

Hiatt, W.R., et al., "Bistable Switching in Niobium Oxide Diodes," Applied Physics Letters, Mar. 15, 1965, pp. 106-108, vol. 6, No. 6, American Institute of Physics, Melville, NY.

Argall, F., "Switching Phenomena in Titanium Oxide Thin Films," Solid-State Electronics, 1968, pp. 535-541, vol. 11, Pergamon Press, Great Britain.

Baek, I.G., et al., "Highly Scalable Non-volatile Resistive Memory using Simple Binary Oxide Driven by Asymmetric Uni-polar Voltage Pulses," International Electron Devices Meeting, 2004, 26 pages, Samsung Electronics Co., Ltd, Korea.

Seo, S., et al., "Reproducible Resistance Switching in Polycrystalline NiO Films," Applied Physics Letters, Dec. 6, 2004, pp. 5655-5657, vol. 85, No. 23, American Institute of Physics, Melville, NY.

Seo, S., et al., "Conductivity Switching Characteristics and Reset Currents in NiO Films," Applied Physics Letters, Feb. 25, 2005, pp. 093509-1-093509-3, vol. 86, No. 9, American Institute of Physics, Melville, NY.

(Continued)

*Primary Examiner* — Alexander Sofocleous
(74) *Attorney, Agent, or Firm* — John S. Economou (57) ABSTRACT

An integrated circuit including a memory element and method for manufacturing the integrated circuit are described. In some embodiments, the memory element includes a switching layer that selectively switches between a low resistance state and a high resistance state, and a positive temperature coefficient layer in thermal contact with the switching layer, the positive temperature coefficient layer having a resistance that increases in response to an increase in temperature.

19 Claims, 5 Drawing Sheets

OTHER PUBLICATIONS

Park, J., et al., "Reproducible Resistive Switching in Nonstoichiometric Nickel Oxide Films Grown by rf Reactive Sputtering for Resistive Random Access Memory Applications," Journal of Vacuum Science & Technology A: Vacuum, Surfaces, and Films, Sep./Oct. 2005, pp. 1309-1313, vol. 23, No. 5, American Vacuum Society.

* cited by examiner

MEMORY ELEMENT WITH POSITIVE TEMPERATURE COEFFICIENT LAYER

BACKGROUND

For some applications, non-volatile memory, which retains its stored data even when power is not present, may be used. For example, non-volatile memory is typically used in digital cameras, portable audio players, wireless communication devices, personal digital assistants, and peripheral devices, as well as for storing firmware in computers and other devices.

A wide variety of memory technologies have been developed. Non-volatile memory technologies include flash memory, magnetoresistive random access memory (MRAM), phase change random access memory (PCRAM), conductive bridging random access memory (CBRAM), and carbon memory. Due to the great demand for memory devices, researchers are continually improving memory technology, and developing new types of memory, including new types of non-volatile memory.

The scale of electronic devices is constantly being reduced. For memory devices, conventional technologies, such as flash memory and DRAM, which store information based on storage of electric charges, may reach their scaling limits in the foreseeable future. Additional characteristics of these technologies, such as the high switching voltages and limited number of read and write cycles of flash memory, or the limited duration of the storage of the charge state in DRAM, pose additional challenges. To address some of these issues, researchers are investigating memory technologies that do not use storage of an electrical charge to store information.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DETAILED DESCRIPTION OF ILLUSTRATIVE EMBODIMENTS

One memory technology that is not based on storage of an electrical charge is resistive memory based on the bistable resistance change in transition metal oxide layers. In certain transition metal oxide materials, in response to the application of an adequate voltage, a conductive path or filament may be formed or removed within the material, due to thermal electronic exchange effects. The formation and removal of this conductive filament is coupled with a thermistor effect, which induces the bistable switching process, due to the inhomogeneous temperature distribution in the transition metal oxide material in response to the application of a voltage.

Among the transition metal chalcogenides, NiO is of particular interest for this application, due to its large band gap of approximately 4.5 eV. At room temperature, NiO in its stoichiometric state is a good isolating semiconductor, which forms its relatively large band gap by means of hybridization of relatively strongly localized 3d electrons with O 2p electron bands. Additionally, NiO has a region with negative differential resistance and monostable switching in the current-voltage (I-U) characteristic due to the steepness of its resistance-temperature characteristic in response to the application of an appropriate voltage due to the thermistor effect ($\sigma \sim e^{-\Delta E/kT}$).

Figure 1A:
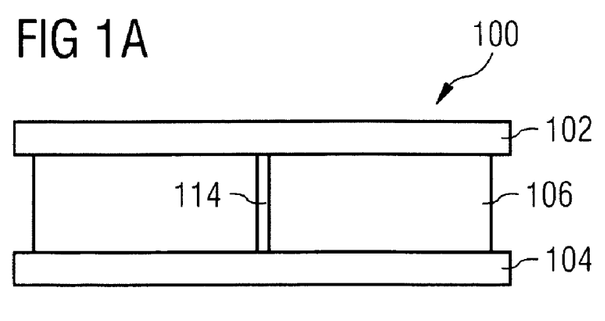
FIGS. 1A and 1B show a resistive memory element in which a conductive filament is formed through a transition metal oxide layer.

FIG. 1A shows a transition metal oxide resistive memory element 100. The resistive memory element 100 includes a top contact 102, a bottom contact 104, and a transition metal oxide layer 106 located between the top contact 102 and the bottom contact 104. The transition metal oxide layer 106 may include any of a number of transition metal compounds, such as NiO, $TiO_2$, $HfO_2$, $ZrO_2$, $Nb_2O_5$, $Ta_2O_5$, or other suitable materials.

When a voltage above a "SET" voltage is applied across the transition metal oxide layer 106, a conductive filament 114 is formed, placing the transition metal oxide layer in an "ON" state, dramatically reducing the resistance of the transition metal oxide layer 106. For example, a SET voltage of approximately 2V applied across an NiO film with a thickness between approximately 20 nm and approximately 100 nm may cause the resistance of the film to drop from approximately 1 KΩ to 10 KΩ (depending on the thickness of the layer) to less than approximately 100 Ω. In some devices, it is also possible to apply various voltages to set multiple resistance levels, which can be used to store multiple bits of information in a single resistive memory element.

Figure 1B:
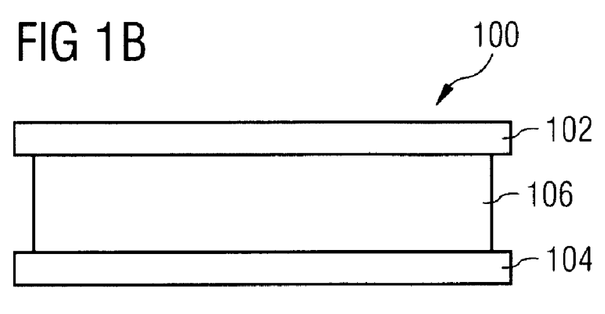

As shown in FIG. 1B, when a "RESET" voltage is applied across the transition metal oxide layer 106 in the "ON" state, the conductive filament 114 is removed, returning the transition metal oxide layer 106 to an "OFF" state, and increasing the resistance of the transition metal oxide layer 106. The "RESET" voltage for use with a transition metal oxide layer including an NiO film may be approximately 1V.

To determine the current memory state of the resistive memory element 100, a sensing current may be routed through the resistive memory element 100. The sensing current encounters a high resistance if no filament 114 exists within the resistive memory element 100, and a low resistance when filament 114 is present. A high resistance may, for example, represent "0", while a low resistance represents "1", or vice versa.

Figure 2A:
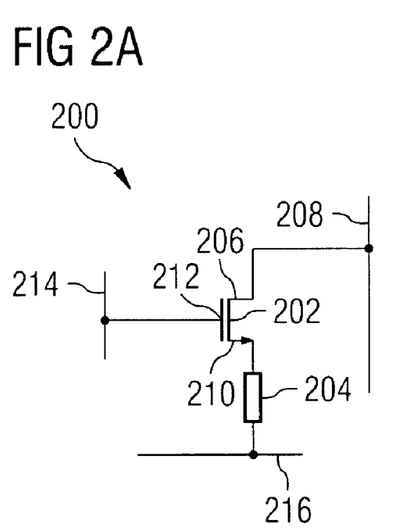
FIGS. 2A and 2B show alternative block diagram layouts of a memory cell using a resistive memory element.

FIG. 2A shows an illustrative memory cell that uses a resistive memory element. The memory cell 200 includes a select transistor 202 and a resistive memory element 204. The select transistor 202 includes a source 206 that is connected to a bit line 208, a drain 210 that is connected to the memory element 204, and a gate 212 that is connected to a word line 214. The resistive memory element 204 is also connected to a common line 216, which may be connected to ground, or to other circuitry, such as circuitry (not shown) for determining the resistance of the memory cell 200, for use in reading. Alternatively, in some configurations, circuitry (not shown) for determining the state of the memory cell 200 during reading may be connected to the bit line 208. It should be noted that as used herein the terms connected and coupled are intended to include both direct and indirect connection and coupling, respectively.

To write to the memory cell, the word line 214 is used to select the cell 200, and a voltage on the bit line 208 is applied through the resistive memory element 204, to form or remove a conductive path or filament in the resistive memory element 204, changing the resistance of the resistive memory element 204. Similarly, when reading the cell 200, the word line 214 is used to select the cell 200, and the bit line 208 is used to apply a reading voltage across the resistive memory element 204 to measure the resistance of the resistive memory element 204.

The memory cell 200 may be referred to as a 1T1J cell, because it uses one transistor, and one memory junction (the resistive memory element 204). Typically, a memory device will include an array of many such cells. It will be understood that other configurations for a 1T1J memory cell, or configurations other than a 1T1J configuration may be used with a resistive memory element. For example, in FIG. 2B, an alternative arrangement for a 1T1J memory cell 250 is shown, in which a select transistor 252 and a resistive memory element 254 have been repositioned with respect to the configuration shown in FIG. 2A.

Figure 2B:
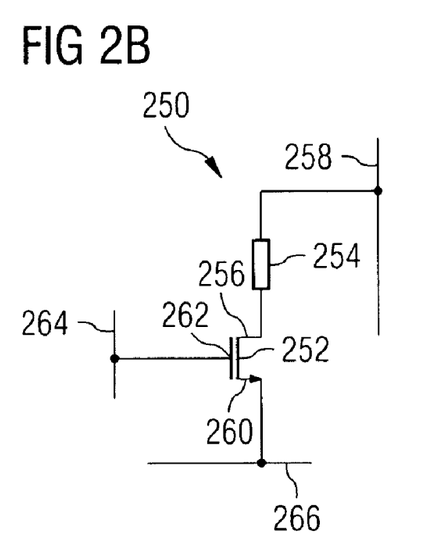

In the alternative configuration shown in FIG. 2B, the resistive memory element 254 is connected to a bit line 258, and to a source 256 of the select transistor 252. A drain 260 of the select transistor 252 is connected to a common line 266, which may be connected to ground, or to other circuitry (not shown), as discussed above. A gate 262 of the select transistor 252 is controlled by a word line 264.

One challenge in producing resistive memories based on bistable switching in NiO and other transition metal oxides (TMOs) is the limited endurance of many such memories. The high initial resistance of TMOs at room temperature and the high current density in the small conductive filaments that are formed, as well as the high thermal budget during the voltage pulses that are used to program these memories may lead to a limited number of switching cycles and variation in switching parameters (e.g., the voltages needed for switching). Elevated current densities in the conductive filament can lead to temperatures in the device that are high enough to cause damage, and to limit the number of switching cycles. For example, in some devices based on NiO, the device may stop switching properly after as few as $10^6$ switching cycles.

In accordance with an embodiment of the invention, a resistive memory element with greater endurance may be provided by adding an adapted positive temperature coefficient (PTC) layer to the switching TMO layer. The PTC layer has a resistance that increases as the temperature increases, balancing the decreasing resistance of the TMO layer at high temperature. Thus, the PTC layer prevents the snowballing elevation of the temperature in a conductive filament in the TMO layer by providing a serial resistance that increases with temperature, preventing a damaging high current density in the conductive filament during a critical increase of the temperature that may occur during writing to the memory. The PTC layer limits the current density in the conductive filament in the TMO, keeping it below a critical density, at which damaging chemical conversion or destruction begins. This increases the number of switching cycles (i.e., the endurance) of the memory element.

Figure 3A:
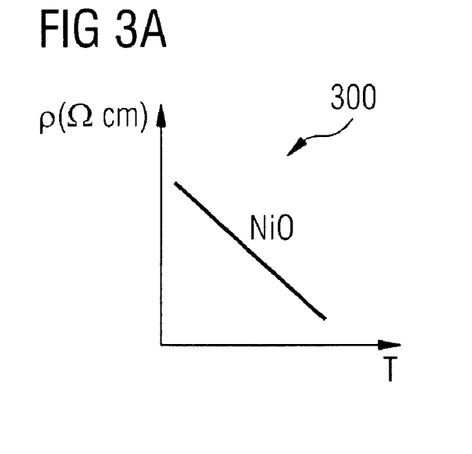
FIGS. 3A and 3B show graphs of volume resistivity as temperature increases for a switching layer material (NiO, in this example) and a positive temperature coefficient (PTC) material, respectively.
Figure 3B:
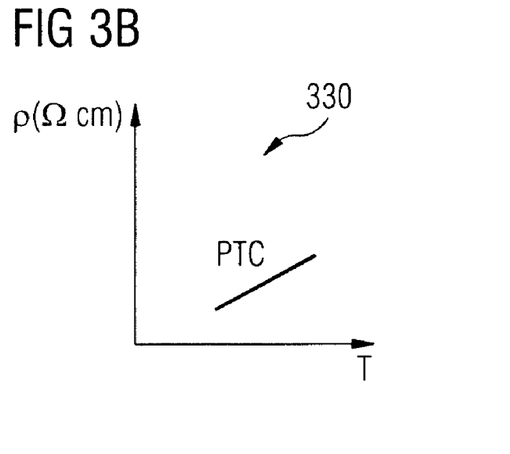

The change in resistance of these layers with changes in temperature is shown in FIGS. 3A and 3B. In FIG. 3A, a graph 300 shows the volume resistivity ($\Omega$cm) of a TMO layer (in this example, NiO) as the temperature increases. As can be seen, the volume resistivity decreases as the temperature increases.

In FIG. 3B, the graph 330 shows the volume resistivity of a PTC layer as the temperature increases. As can be seen, the volume resistivity increases as the temperature increases.

Figure 4:
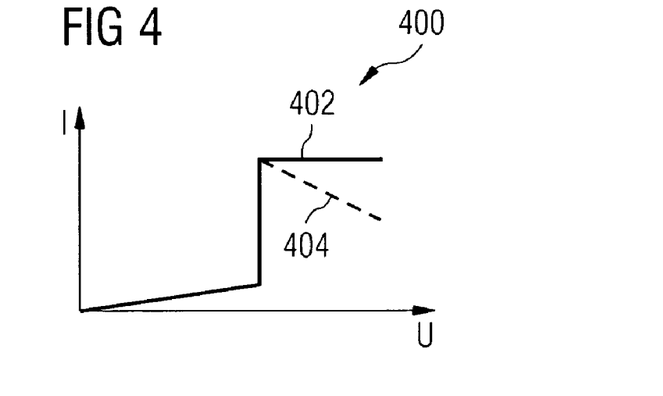
FIG. 4 is a graph showing an effect of serially connecting a switching layer and a PTC layer, in accordance with an embodiment of the invention.

FIG. 4 shows the effect of combining a switching layer, such as a TMO layer, having a negative temperature coefficient, with a PTC layer, having a positive temperature coefficient. As seen in the current-voltage (I-U) graph 400, in the absence of a PTC layer, as shown in a portion 402 of the graph 400, the current reaches a high level, and remains high, while the temperature continues to increase. This can cause damage to the switching layer, and reduce the endurance of the memory element. In a portion 404 of the graph 400, the reduced thermal budget for a resistive memory element including a PTC layer is shown. Serial connection of the switching layer with a PTC layer prevents high current densities in the conductive filament, and high temperatures in the memory element.

Figure 5:
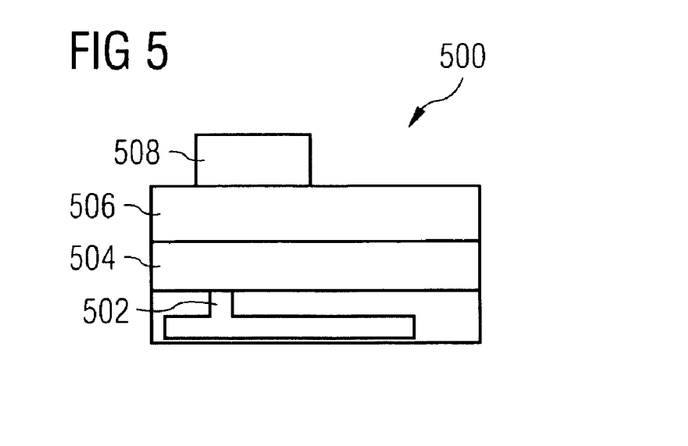
FIG. 5 shows a memory element having a switching layer and a PTC layer, in accordance with an embodiment of the invention.

FIG. 5 shows an example embodiment of a resistive memory element in accordance with an embodiment of the invention. A resistive memory element 500 includes a bottom contact 502, a switching layer 504, a PTC layer 506, and a top contact 508. The switching layer 504 includes a TMO material, such as NiO, $TiO_2$, $HfO_2$, $ZrO_2$, $Nb_2O_5$, $Ta_2O_5$, or other suitable materials. Many such materials exhibit a bistable resistance change. For embodiments in which NiO is used in the switching layer 504, the NiO may preferably have an oxygen deficiency, so that the switching layer 504 includes $NiO_{1-x}$, where x is in the range of approximately 0.01 to approximately 0.15, and preferably in the range of approximately 0.01 to approximately 0.1.

The PTC layer 506 is in thermal contact with the switching layer 504, and is electrically connected in series with the switching layer 504. The PTC layer 506 may include a material such as $BaTiO_3$, $Ba_xSr_{1-x}TiO_3$, or another material having a positive temperature coefficient. Preferably, the material used in the PTC layer 506 has an ability to react reasonably quickly to a temperature increase with an increase in resistance.

As explained above, when a "SET" voltage is applied across the switching layer 504, a conductive path or filament forms, placing the resistive memory element 500 in a low resistance state. When a "RESET" voltage is applied, the conductive path or filament is removed, placing the resistive memory element 500 in a high resistance state. The resistivity of the resistive memory element 500 determines the value stored. For example, the high resistance state may represent a "0" and the low resistance state may represent a "1", or vice versa. Alternatively, in some embodiments, application of various voltages may be used to set the resistance to selected levels that may be used to represent multiple bits of information in a single memory element.

Figure 6:
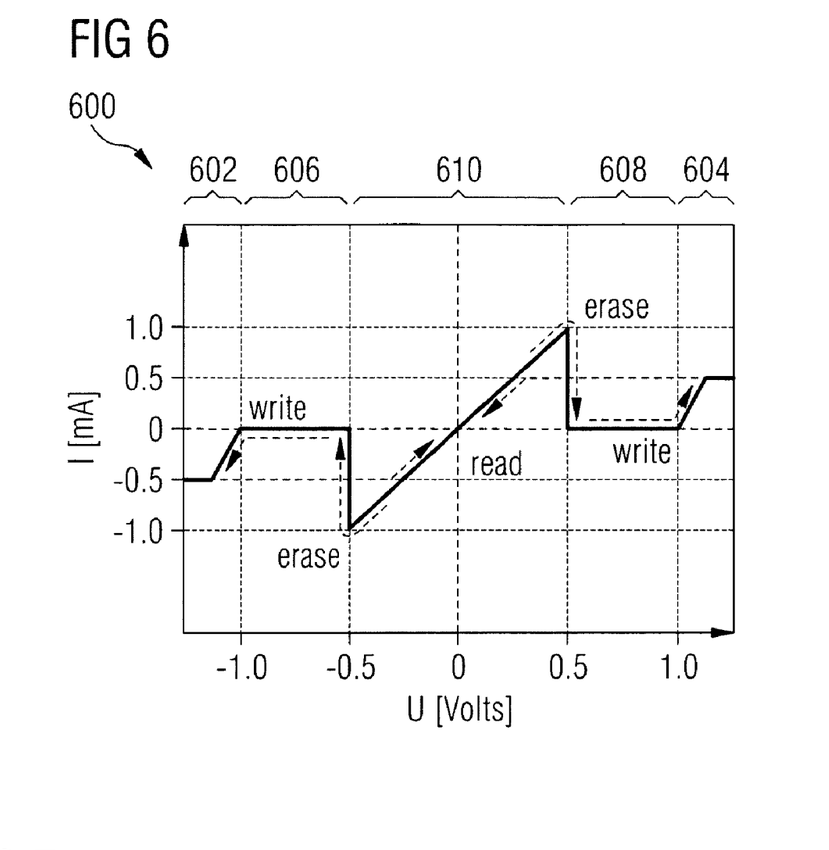
FIG. 6 is a graph showing the voltage and current levels for reading, writing, and erasing a resistive memory element, in accordance with an embodiment of the invention.

FIG. 6 shows a graph 600 of the voltage and current characteristics for reading, writing, and erasing a memory device of the type described above. As can be seen in sections 602 and 604 of the graph 600, writing is carried out by application of a large bias. For example, a bias of greater than +/−1 V provides an adequate "SET" voltage, placing the memory in a low resistance state. Applying a slightly lower bias, as shown in regions 606 and 608 of the graph 600 will provide a "RESET" voltage, erasing the memory. For example, a bias of approximately +/−0.5 V erases the memory, placing it in a high resistance state. As shown in a region 610 of the graph 600, a bias lower than the "RESET" level may be used for reading the memory. For example, as shown in the graph 600, a bias between −0.5 V and +0.5 V may be used for reading. In accordance with an embodiment of the invention, the presence of a PTC layer prevents the current from reaching superelevated levels during writing, increasing the endurance of the memory.

Figure 7:
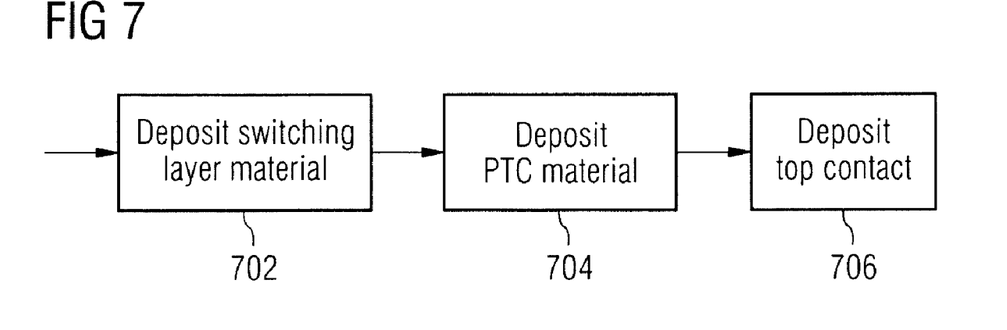
FIG. 7 is a block diagram of a method for fabricating a memory element in accordance with an embodiment of the invention.

Referring now to FIG. 7, an example of a method of manufacturing a resistive memory element in accordance with an embodiment of the invention is described. As described, the method starts with a conventionally pre-cleaned silicon wafer. Depending on the integration scheme, as described below, the wafer may already include select transistors, vias, an isolation layer, a bottom electrode, and/or other components used in the formation of integrated circuit memory devices. In some embodiments, such as those in which appropriate contact lines are required, these structures may be manufactured using CMOS technology. Generally, the conventional components described above may be deposited on the wafer or substrate using conventional CMOS technology, or any other technology or methods now known or later developed. Thus, the method described with reference to FIG. 7 shows only the manufacture of the switching layer, the PTC layer, and the top contact. The processes shown in this example is CMOS compatible.

In step 702, a switching layer material, which may, for example, include a transition metal oxide compound is deposited. In some embodiments, this may be accomplished using reactive DC sputtering of metal targets in an argon/oxygen working gas. In alternative embodiments, a TMO material may be deposited by means of RF sputtering of an oxidic compound target in a pure Ar atmosphere, or with additives such as $O_2$ or $N_2$. Depending on the desired composition of the TMO compound being deposited, the metal target may include metals such as Ni, Ti, Hf, Zr, Nb, Ta, or other suitable metals. In some embodiments, deposition of the switching layer material may continue until a switching layer having a thickness in the range of approximately 20 nm to approximately 50 nm has been deposited. Other methods of depositing a switching layer, and switching layers having greater or lower thickness may also be used in accordance with various embodiments of the invention.

In step 704, the PTC layer is deposited. In some embodiments, the PTC layer may have a nanocrystalline structure, and may include materials such as $BaTiO_3$, $Ba_xSr_{1-x}$, or $TiO_3$. The PTC layer may be deposited by means of RF sputtering from a compound target in an Ar atmosphere with little $O_2$ additive. In this case, a substrate temperature of approximately 300° C. may be used. In some embodiments, the PTC layer should be deposited to a thickness in the range of approximately 30 nm to 50 nm. In some embodiments, other PTC materials, methods of deposition, and thicknesses may be used.

In step 706, a top contact is deposited. The top contact may include metals such as Ti, Pd, or Pt, and may be deposited by means of DC sputtering. After the top contact has been deposited, the memory device may be completed using conventional techniques.

Figure 8A:
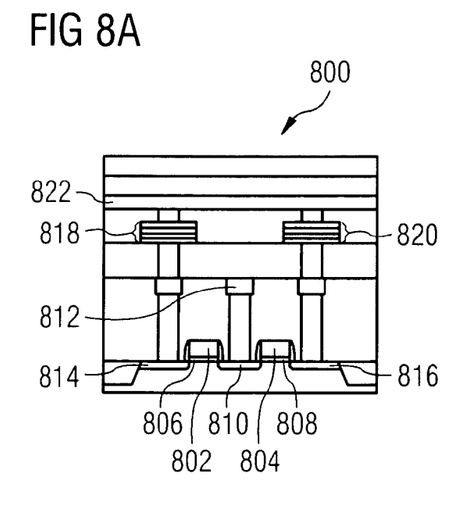
FIGS. 8A and 8B show a cross section of an integrated circuit including two memory cells in accordance with an embodiment of the invention, and a schematic representation of a memory cell of the integrated circuit, respectively.

Referring to FIG. 8A, a cross section an integrated circuit including two memory cells of a memory device in accordance with an embodiment of the invention is shown. While the cross section provides an integration scheme that would be suitable for use with a resistive memory device according to some embodiments of the present invention, a similar integration scheme may also be used for conventional resistive memory devices. Similarly, a resistive memory element according to an embodiment of the invention is not limited to use in a device such as is shown in FIG. 8.

As can be seen, the integrated circuit 800 includes word lines 802 and 804, which connect to the gates of select transistors 806 and 808. A shared drain 810 of the select transistors 806 and 808 is connected to a common line 812, which may be connected to ground. The source region 814 of the select transistor 806 and the source region 816 of the select transistor 808 are connected to resistive memory elements 818 and 820, respectively. Each of the resistive memory elements 818 and 820 has a bottom electrode, a switching layer that may include a TMO material, a PTC layer, and a top electrode. The resistive memory elements 818 and 820 are connected to a bit line 822.

Figure 8B:
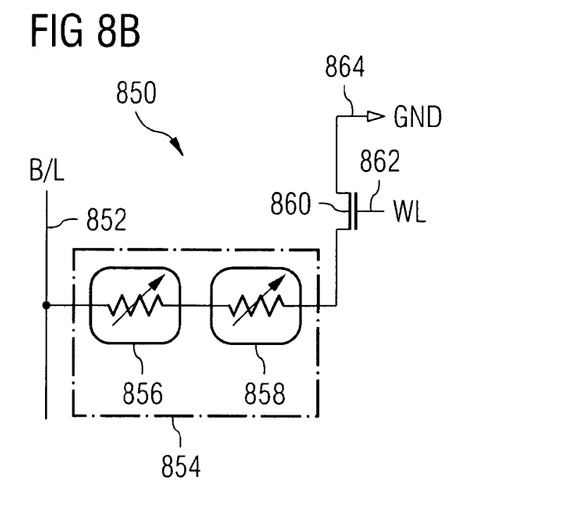

In FIG. 8B, a schematic for a memory cell from the device shown in FIG. 8A is shown. In the resistive memory cell 850, a bit line 852 is connected to a resistive memory element 854, which includes a resistive switching element 856 and a PTC element 858. The memory element 854 is connected to a source of a transistor 860. A word line 862 is connected to a gate of the transistor 860, and a drain of the transistor 860 is connected to a common line 864, which is shown in this example as being connected to ground.

Referring to FIGS. 9A-9F, example steps in a process for constructing a bottom contact for use with a resistive memory element are described. It will be understood that this process, and the bottom contact that is created using it, may be used with a conventional resistive memory element, as well as a resistive memory element according to an embodiment of the invention. It will further be recognized that a resistive memory element according to the invention is not limited to using a bottom contact constructed by such a process, but may use any suitable bottom contact, constructed by any process now known or later developed.

Figure 9A:
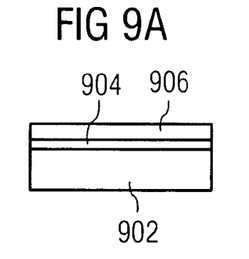
FIGS. 9A-9F show steps in the formation of a bottom contact that may be used with a memory element in accordance with an embodiment of the invention.
Figure 9B:
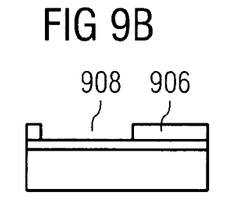

FIG. 9A shows an oxide layer 902 onto which a nitride etch stop 904 has been deposited, as well as an additional oxide layer 906. As shown in FIG. 9B, a lithographic process and etching is used to create a trench 908 in the oxide layer 906 for the bottom contact.

Figure 9C:
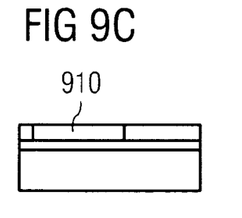

FIG. 9C shows a conductive material 910, such as tungsten (W), deposited in the trench 908, and planarized, for example by a chemical mechanical planarization process.

Figure 9D:
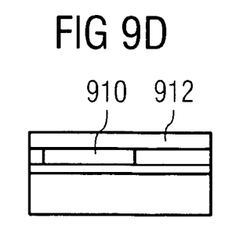
Figure 9E:
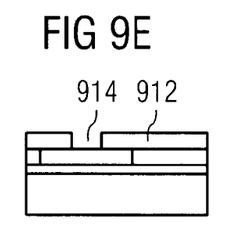

In FIG. 9D, a nitride/oxide layer 912 has been deposited over the conductive material 910. As shown in FIG. 9E, a lithographic process and etching are used to form a hole 914 in the nitride/oxide layer 912.

Figure 9F:
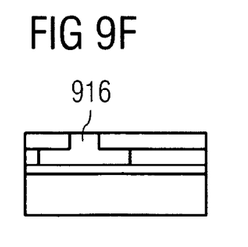

Next, as shown in FIG. 9F, the hole 914 is filled with TiN/W or another suitable material, and planarized, completing construction of a bottom contact 916. Once the bottom contact has been deposited, a method such as is described above with reference to FIG. 7 may be used to construct a memory element above the bottom contact, in accordance with an embodiment of the invention.

Figure 10:
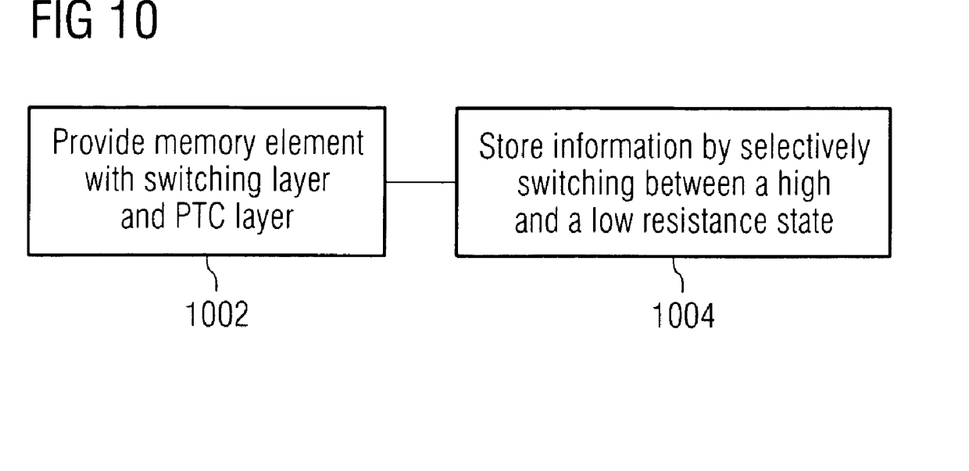
FIG. 10 is a block diagram of a method of storing information in accordance with an embodiment of the invention.

Referring now to FIG. 10, a method of storing information in accordance with an embodiment of the invention is described. In step 1002, a resistive memory element is provided. The resistive memory element includes a switching layer, which may include a TMO material, and a PTC layer. As discussed above, the PTC layer may prevent high current densities and high temperatures in the memory element, increasing the number of switching cycles of the memory element.

In step 1004, information is stored in the resistive memory element by selectively switching between a high resistance state and a low resistance state by reversibly forming a conductive filament in the switching layer.

Memory cells and elements such as are described above may be used in memory devices that contain large numbers of memory cells. These cells may, for example, be organized into an array of memory cells having numerous rows and columns of cells, wherein each cell stores one or more bits of information.

Figure 11A:
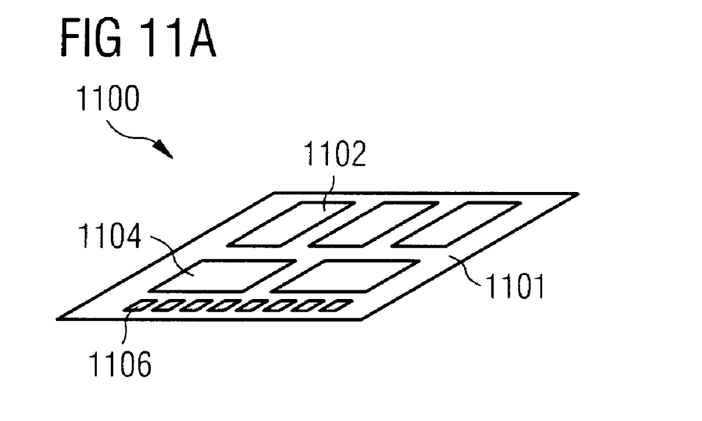
FIGS. 11A and 11B show, respectively, a memory module and a stack of modules, in accordance with an embodiment of the invention.
Figure 11B:
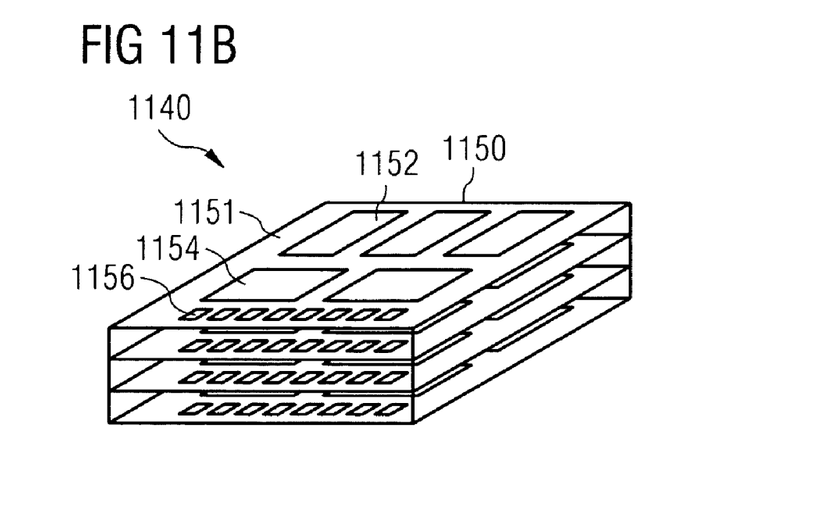

As shown in FIGS. 11A and 11B, in some embodiments, such memory devices may be used in modules. In FIG. 11A, a memory module 1100 is shown, on which one or more memory devices 1102 are arranged on a substrate 1101. Each memory device 1102 may include an array of memory cells, each of which uses a memory element in accordance with an embodiment of the invention. The memory module 1100 may also include one or more devices 1104, which may include memory, processing circuitry, control circuitry, addressing circuitry, bus interconnection circuitry, or other circuitry that may be combined on a module with memory. Additionally, the memory module 1100 includes multiple electrical connections 1106, which may be used to connect the memory module 1100 to other electronic components, including other modules.

As shown in FIG. 11B, in some embodiments, these modules may be stackable, to form a stack 1140 of stackable modules. For example, a stackable memory module 1150 may contain one or more memory devices 1152, arranged on a stackable substrate 1151. Each of the memory devices 1152 contains an array of memory cells that employ memory elements as described above. The stackable memory module 1150 may also include devices 1154, which may include memory, processing circuitry, control circuitry, addressing circuitry, bus interconnection circuitry, or other circuitry that may be combined on a module with memory. Electrical connections 1156 are used to connect the stackable memory module 1150 with other modules in the stack 1140, or with other electronic devices. Other modules in the stack may be additional stackable memory modules, such as the stackable memory module 1150 described above, or other types of stackable modules, such as stackable processing modules, control modules, communication modules, or other modules containing one or more electronic components.

Thus, in one embodiment, the present invention provides an integrated circuit including a memory element that includes a top contact, a bottom contact, a switching layer disposed between the top contact and the bottom contact, and a positive temperature coefficient layer in thermal contact with the switching layer. The switching layer selectively switches between a low resistance state and a high resistance state, and a resistance of the positive temperature coefficient layer increases in response to an increase in temperature.

In some embodiments, the switching layer includes a transition metal oxide material. In some embodiments, the positive temperature coefficient layer is electrically connected in series with the switching layer. In some embodiments, the positive temperature coefficient layer increases the number of switching cycles of the memory element.

In another embodiment, a method of manufacturing an integrated circuit is provided. The method includes depositing a switching layer material above a substrate, the switching layer material being capable of selectively switching between a low resistance state and a high resistance state, and depositing a positive temperature coefficient material above the substrate in thermal contact with the switching layer material, the positive temperature coefficient material having a resistance that increases in response to an increase in temperature.

In some embodiments, depositing a switching layer material above a substrate includes depositing a transition metal oxide material. In some embodiments, depositing a positive temperature coefficient material includes depositing the positive temperature coefficient material so that it is electrically connected in series with the switching layer material.

In another embodiment, the invention provides a memory element that includes a top contact, a bottom contact, and a switching layer disposed between the top contact and the bottom contact, the switching layer selectively switching between a low resistance state and a high resistance state. The memory element also provides a positive temperature coefficient layer in thermal contact with the switching layer, the positive temperature coefficient layer having a resistance that increases in response to an increase in temperature.

In some embodiments, the switching layer includes a bistable switching material. In some embodiments, the switching layer includes a transition metal oxide material. In some of these embodiments, the transition metal oxide material includes NiO, $TiO_2$, $HfO_2$, $ZrO_2$, $Nb_2O_5$, or $Ta_2O_5$. In some embodiments, the transition metal oxide material comprises $NiO_{1-x}$, where x is in the range of approximately 0.01 to approximately 0.15. In some of these embodiments, x is in the range of approximately 0.01 to approximately 0.1.

In some embodiments, the positive temperature coefficient layer is electrically connected in series with the switching layer. In some embodiments, the positive temperature coefficient layer includes at least one of $BaTiO_3$, $TiO_3$, and a $Ba_xSr_{x-1}$ compound.

In some embodiments, the switching layer switches between the high resistance state and the low resistance state by forming a conductive filament within the switching layer. In some of these embodiments, the positive temperature coefficient layer limits the current density in the conductive filament.

In some embodiments, the positive temperature coefficient layer increases the number of switching cycles of the memory element.

In another embodiment, a method of producing a memory element is provided. The method includes depositing a switching layer material, the switching layer material being capable of selectively switching between a low resistance state and a high resistance state, and depositing a positive temperature coefficient material in thermal contact with the switching layer material, the positive temperature coefficient material having a resistance that increases in response to an increase in temperature.

In some embodiments, depositing a switching layer material includes using a CMOS compatible process to deposit the switching layer material. In some embodiments, depositing a positive temperature coefficient material includes using a CMOS compatible process to deposit the positive temperature coefficient material.

In some embodiments, depositing a switching layer material includes depositing a transition metal oxide material. In certain of these embodiments, depositing a transition metal oxide material includes reactive DC sputtering of a metal target in an argon/oxygen working gas. In some embodiments, depositing a transition metal oxide material includes RF sputtering of an oxidic compound target.

In some embodiments, depositing a positive temperature coefficient material includes a material comprising at least one of $BaTiO_3$, $TiO_3$, and a $Ba_xSr_{1-x}$ compound. In some embodiments, depositing a positive temperature coefficient material includes RF sputtering from a compound target.

In some embodiments, depositing a switching layer material includes depositing a layer of the switching layer material having a thickness in the range of approximately 20 nm to approximately 50 nm. In some embodiments, depositing a positive temperature coefficient material includes depositing a layer of the positive temperature coefficient material having a thickness in the range of approximately 30 nm to approximately 50 nm.

In still another embodiment, the invention provides an integrated circuit including a memory cell that includes a select transistor and a memory element coupled to the select transistor. The memory element includes a switching layer and a positive temperature coefficient layer in thermal contact with the switching layer, wherein a resistance of the positive temperature coefficient layer increases in response to an increase in temperature. Information is stored by selectively switching the switching layer between a low resistance state and a high resistance state.

In some embodiments, the switching layer includes a transition metal oxide material. In some embodiments, the positive temperature coefficient layer is electrically connected in series with the switching layer. In some embodiments, the positive temperature coefficient layer increases the number of switching cycles of the memory element.

In a further embodiment, the invention provides a memory cell that includes a select transistor, and a memory element coupled to the select transistor. The memory element includes a switching layer and a positive temperature coefficient layer in thermal contact with the switching layer, wherein a resistance of the positive temperature coefficient layer increases in response to an increase in temperature. Information is stored by selectively switching the switching layer between a low resistance state and a high resistance state.

In some embodiments, the switching layer comprises a transition metal oxide material. In some embodiments, the positive temperature coefficient layer is electrically connected in series with the switching layer. In some embodiments, the switching layer switches between the high resistance state and the low resistance state by forming a conductive filament within the switching layer. In some of these embodiments, the positive temperature coefficient layer limits the current density in the conductive filament. In some embodiments, the positive temperature coefficient layer increases the number of switching cycles of the memory element.

In another embodiment, the invention provides a method for storing information. The method includes providing a memory element including a switching layer and a positive temperature coefficient layer, wherein a resistance of the positive temperature coefficient layer increases in response to an increase in temperature. The method further includes selectively switching the resistive memory element between a low resistance state and a high resistance state to store information.

In some embodiments, providing a memory element includes providing a switching layer including a transition metal oxide. In some embodiments, providing a memory element includes electrically connecting the positive temperature coefficient layer in series with the switching layer. In some embodiments, providing a memory element includes providing a positive temperature coefficient layer that increases the number of switching cycles of the memory element.

Another embodiment of the invention provides a memory module. The memory module includes a plurality of integrated circuits, wherein the integrated circuits include a resistive memory element including a switching layer and a positive temperature coefficient layer in thermal contact with the switching layer. The switching layer selectively switches between a low resistance state and a high resistance state. Additionally, a resistance of the positive temperature coefficient layer increases in response to an increase in temperature.

In some embodiments, the switching layer includes a transition metal oxide material. In some embodiments, the positive temperature coefficient layer is electrically connected in series with the switching layer. In some embodiments, the positive temperature coefficient layer increases the number of switching cycles of the memory element. In some embodiments, the memory module is stackable.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. An integrated circuit comprising:
   a memory element that comprises a top contact, a bottom contact, a switching layer disposed between the top contact and the bottom contact, and a positive temperature coefficient layer in thermal contact with the switching layer,
   wherein the switching layer selectively switches between a low resistance state and a high resistance state, wherein the switching layer comprises a transition metal oxide material, wherein the transition metal oxide material comprises $NiO_{1-x}$, where x is in the range of approximately 0.01 to approximately 0.15; and
   wherein a resistance of the positive temperature coefficient layer increases in response to an increase in temperature.

2. The integrated circuit of claim 1, wherein the switching layer comprises a bistable switching material.

3. The integrated circuit of claim 1, wherein the positive temperature coefficient layer is electrically connected in series with the switching layer.

4. The integrated circuit of claim 1, wherein the positive temperature coefficient layer comprises at least one of $BaTiO_3$, $TiO_3$, and/or a $Ba_xSr_{1-x}$ compound.

5. The integrated circuit of claim 1, wherein the switching layer switches between the high resistance state and the low resistance state by forming a conductive filament within the switching layer.

6. The integrated circuit of claim 5, wherein the positive temperature coefficient layer limits a current density in the conductive filament.

7. The integrated circuit of claim 1, wherein the positive temperature coefficient layer increases a number of switching cycles of the memory element.

8. A method of manufacturing an integrated circuit, the method comprising:
  depositing a switching layer material above a substrate, the switching layer material being capable of selectively switching between a low resistance state and a high resistance state, wherein the switching layer comprises a transition metal oxide material, wherein the transition metal oxide material comprises $NiO_{1-x}$, where x is in the range of approximately 0.01 to approximately 0.15; and
  depositing a positive temperature coefficient material in thermal contact with the switching layer material, the positive temperature coefficient material having a resistance that increases in response to an increase in temperature.

9. The method of claim 8, wherein depositing the positive temperature coefficient material comprises a material comprising at least one of $BaTiO_3$, $TiO_3$, and/or a $Ba_xSr_{1-x}$ compound.

10. The method of claim 8, wherein depositing the switching layer material comprises depositing a layer of the switching layer material having a thickness in the range of approximately 20 nm to approximately 50 nm.

11. The method of claim 8, wherein depositing the positive temperature coefficient material comprises depositing a layer of the positive temperature coefficient material having a thickness in the range of approximately 30 nm to approximately 50 nm.

12. An integrated circuit comprising:
  a memory cell that comprises a select transistor and a memory element coupled to the select transistor, the memory element comprising a switching layer and a positive temperature coefficient layer in thermal contact with the switching layer;
  wherein a resistance of the positive temperature coefficient layer increases in response to an increase in temperature;
  wherein the switching layer comprises a transition metal oxide material, wherein the transition metal oxide material comprises $NiO_{1-x}$, where x is in the range of approximately 0.01 to approximately 0.15; and
  wherein information is stored by selectively switching the switching layer between a low resistance state and a high resistance state.

13. The integrated circuit of claim 12, wherein the positive temperature coefficient layer is electrically connected in series with the switching layer.

14. The integrated circuit of claim 12, wherein the switching layer switches between the high resistance state and the low resistance state by forming a conductive filament within the switching layer.

15. The integrated circuit of claim 14, wherein the positive temperature coefficient layer limits a current density in the conductive filament.

16. A method for storing information, the method comprising:
  providing a memory element comprising a switching layer and a positive temperature coefficient layer adjacent the switching layer,
  wherein the switching layer comprises a transition metal oxide material, wherein the transition metal oxide material comprises $NiO_{1-x}$, where x is in the range of approximately 0.01 to approximately 0.15,
  wherein a resistance of the positive temperature coefficient layer increases in response to an increase in temperature; and
  selectively switching the memory element between a low resistance state and a high resistance state to store information.

17. The method of claim 16, wherein providing the memory element comprises electrically connecting the positive temperature coefficient layer in series with the switching layer.

18. A memory module comprising:
  a plurality of integrated circuits, wherein each integrated circuit comprises a resistive memory element comprising a switching layer and a positive temperature coefficient layer in thermal contact with the switching layer, wherein the switching layer selectively switches between a low resistance state and a high resistance state; and wherein a resistance of the positive temperature coefficient layer increases in response to an increase in temperature; wherein the switching layer comprises a transition metal oxide material, wherein the transition metal oxide material comprises $NiO_{1-x}$, where x is in the range of approximately 0.01 to approximately 0.15; and wherein the integrated circuits are electrically coupled together to form a module.

19. The memory module of claim 18, wherein the memory module is stackable.

* * * * *